United States Patent [19]

Mori et al.

[11] Patent Number: 4,614,701

[45] Date of Patent: Sep. 30, 1986

[54] PHOTOCURABLE DIAZO OR AZIDE COMPOSITION WITH ACRYLIC COPOLYMER HAVING HYDROXY AND AMINO GROUPS ON SEPARATE ACRYLIC MONOMER UNITS

[75] Inventors: Hirofumi Mori, Suita; Hitoshi Hori, Jyoyo, both of Japan

[73] Assignee: Sekisui Fine Chemical Co., Ltd., Osaka, Japan

[21] Appl. No.: 655,453

[22] Filed: Sep. 28, 1984

[51] Int. Cl.[4] .......................... G03C 1/54; G03C 1/71
[52] U.S. Cl. .................................. 430/175; 430/152; 430/176; 430/197; 430/145
[58] Field of Search ............... 430/175, 176, 152, 197, 430/145

[56] References Cited

U.S. PATENT DOCUMENTS

| | | | |
|---|---|---|---|
| 3,733,200 | 5/1973 | Takaishi et al. | 430/176 |
| 3,841,874 | 10/1974 | Nishino | 430/152 |
| 4,123,276 | 10/1978 | Kita et al. | 430/176 |
| 4,186,069 | 1/1980 | Muzyczko et al. | 430/175 |
| 4,219,616 | 8/1980 | Pope et al. | 430/152 |
| 4,220,700 | 9/1980 | McGuckin et al. | 430/175 |
| 4,391,894 | 7/1983 | Shimazu et al. | 430/175 |

FOREIGN PATENT DOCUMENTS

| | | | |
|---|---|---|---|
| 91107345 | 6/1984 | Japan | 430/175 |
| 2095854 | 10/1982 | United Kingdom | 430/175 |

OTHER PUBLICATIONS

Journal of Television Society, vol. 37, No. 7(1983), pp. 35–40.
Kosar, J., "Light-Sensitive Systems", J. Wiley & Sons, 1965, p. 278.

*Primary Examiner*—Charles L. Bowers, Jr.
*Attorney, Agent, or Firm*—Wenderoth, Lind & Ponack

[57] ABSTRACT

A photocurable resin composition comprising (A) a copolymer composed of, as structural units,
(a) 20 to 70% by weight of a hydroxyl group-containing acrylic monomer unit represented by the following formula

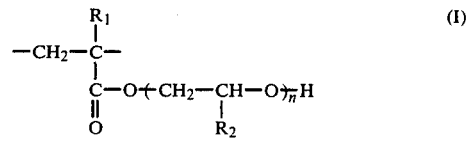

(I)

wherein $R_1$ and $R_2$, independently from each other, represent a hydrogen atom, a methyl group or an ethyl group and n is 1, 2 or 3, and (b) 5 to 80% by weight of a nitrogen-containing acrylic monomer unit represented by the following formula

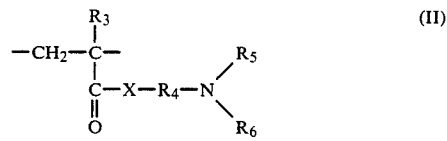

(II)

or

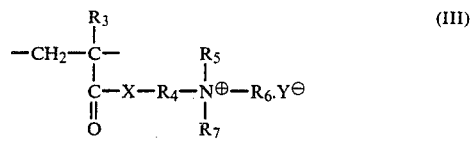

(III)

wherein $R_3$ represents a hydrogen atom or a methyl group, X represents O or NH, $R_4$ represents a linear or branched alkylene group having 2 or 3 carbon atoms, $R_5$, $R_6$ and $R_7$, independently from each other, represent a hydrogen atom or a linear or branched alkyl group having 1 to 4 carbon atoms and $Y^\ominus$ represents an anion of an acid, and (B) a diazo compound or an azide compound.

7 Claims, No Drawings

PHOTOCURABLE DIAZO OR AZIDE COMPOSITION WITH ACRYLIC COPOLYMER HAVING HYDROXY AND AMINO GROUPS ON SEPARATE ACRYLIC MONOMER UNITS

This invention relates to a novel photocurable resin composition, and more specifically, to a photocurable resin composition which gives a photocured product dyeable with an acid dye.

Photosensitive resins are used to form colored images on colorless transparent films to prepare photographic filters, filters for printing, filters for video camera tubes, etc. The simplest method of forming such colored images comprises coating a solution of a photosensitive resin colored in advance by dissolving a dye or a pigment on a support such as glass, exposing the coated support imagewise to actinic light through a negative to cure the exposed portions, and removing the unexposed portions by dissolving them with a developing solution. In this method, the curing reaction of the resin by exposure is likely to be inhibited by the dye or pigment. Even when such inhibition does not occur, coloring of the photosensitive resin in deep colors prevents actinic light from penetrating completely into the inside of the photosensitive resin layer and curing of the resin cannot be effected sufficiently. It is difficult therefore to color the photosenstive resin in deep colors.

In contrast, when a colorless image of a photocured resin is formed on a support by using a photosensitive resin solution not containing a dye and thereafter the support is dipped in a dye bath to dye the image, the curing reaction of the photosensitive resin solution proceeds without being affected by the dye, and a colored image of a relatively high density can be formed. In this process, acid dyes are preferably used because of their excellent weatherability among coloring dyes. A composition comprising casein, gelatin or fish glue and a bichromate salt has previously been known as a photosensitive resin composition capable of being colored with acid dyes. Since such composition contains a natural polymer as a main component, it has various defects. For example, it is impossible to obtain compositions in which the molecular weight distribution of the polymer, or the concentration of a functional group such as an amino group, which takes part in dyeing, is constant. Such a composition is susceptible to spoilage. Since the photosensitive resin solution containing a bichromate salt reacts even in the dark, its pot life is short. Furthermore, the adhesion of the resulting cured film to a support such as glass is poor, and chromium compounds toxic to humans must be used. It has been strongly desired therefore to develop a photocurable resin composition which is free from such defects and gives a photocured product capable of being dyed with acid dyes.

It is a principal object of this invention to provide an improved photocurable resin composition which eliminates the aforesaid defects of conventional photocurable compositions used for the formation of colored images.

The present inventors started with the idea that synthetic polymers containing monomeric units having basic nitrogen have excellent dyeability with acid dyes, and first studied polymers having structural monomeric units containing aniline or a nitrogen-containing heterocyclic ring such as pyridine, oxazolidine and pyrimidine. They found however that these polymers have the serious defect of tending strongly to turn yellow brown or black upon contact with oxygen in the air. They furthered their study and have now found that acrylic polymers comprising monomeric units containing a specified amino group or ammonium salt group as structural units meet the aforesaid requirement.

According to this invention, there is provided a photocurable resin composition comprising
(A) a copolymer composed of, as structural units,
  (a) 20 to 70% by weight of a hydroxyl group-containing acrylic monomer unit represented by the following formula

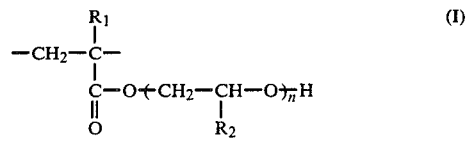

(I)

wherein $R_1$ and $R_2$, independently from each other, represent a hydrogen atom, a methyl group or an ethyl group and n is 1, 2 or 3, and
  (b) 5 to 80% by weight of a nitrogen-containing acrylic monomer unit represented by the following formula

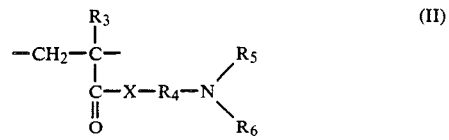

(II)

or

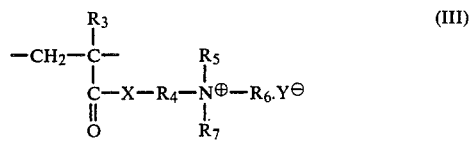

(III)

wherein $R_3$ represents a hydrogen atom or a methyl group, X represents O or NH, $R_4$ represents a linear or branched alkylene group having 2 or 3 carbon atoms, $R_5$, $R_6$ and $R_7$, independently from each other, represent a hydrogen atom or a linear or branched alkyl group having 1 to 4 carbon atoms and $Y^\ominus$ represents an anion of an acid, and
(B) a diazo compound or an azide compound.

A hydroxyl group-containing acrylic monomer represented by the following formula

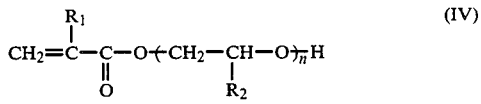

(IV)

wherein $R_1$, $R_2$ and n are as defined above, may be used to form the structural unit (a) of the copolymer (A). Examples of suitable acrylic monomers of formula (IV) include 2-hydroxyethyl acrylate, 2-hydroxyethyl methacrylate, 2-hydroxypropyl acrylate and 2-hydroxypropyl methacrylate. 2-Hydroxyethyl methacrylate is especially preferred because of its excellent crosslinkability and excellent adhesion to a support such as glass. Conveniently, the amount of the hydroxyl group-containing monomer of formula (IV) is 20 to 70% by weight, preferably 30 to 60% by weight, most preferably 40 to 55% by weight, based on the weight of the copolymer. If it is too small, the crosslinkability or photocurability of the resulting copolymer becomes insufficient and its adhesion to substrates becomes insufficient. If it is too large, on the other hand, the solubility of the copolymer in water becomes poor, and the developing solution is restricted by organic solvents. Furthermore, since this results in a relative decrease of the proportion of the structural unit of general formula (II) or (III), the dyeability of the copolymer is reduced.

Examples of suitable nitrogen-containing acrylic monomers represented by the following formula

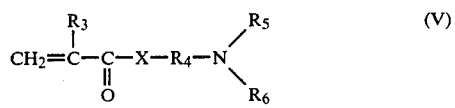

wherein $R_3$, $R_4$, $R_5$, $R_6$ and X are as defined hereinabove,
which can be converted to the nitrogen-containing acrylic monomer unit (b) of formula (II) include N,N-dimethylaminoethyl acrylate, N,N-diethylaminoethyl acrylate, N,N-dimethylaminoethyl methacrylate, N,N-diethylaminoethyl methacrylate, N,N-dimethylaminopropyl acrylamide, N,N-diethylaminopropyl acrylamide, N,N-dimethylaminopropyl methacrylamide and N,N-diethylaminopropyl methacrylamide. N,N-dimethylaminopropyl methacrylamide is especially preferred because the resulting copolymer is scarcely discolored by oxygen, it has high polymerizability, and a photocured product of the resulting copolymer is easily dyed with acid dyes and has good developability.

Examples of an anion of an acid in a nitrogen-containing acrylic monomer represented by the following formula

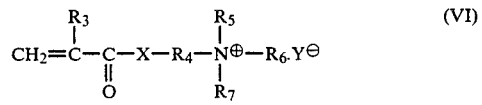

wherein $R_3$, $R_4$, $R_5$, $R_6$, $R_7$, X and $Y^\ominus$ are as defined hereinabove,
which can be converted to the nitrogen-containing acrylic monomer (b) of formula (III) include anions of inorganic acids such as $Cl^\ominus$, $Br^\ominus$, $I^\ominus$ and $SO_4^{2\ominus}$ and anions of organic acids such as $CH_3COO^\ominus$, $HCOO^\ominus$,

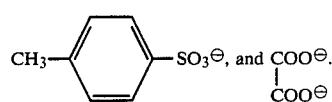

The monomer of formula (VI) can be prepared, for example, by reacting the amino group-containing acrylic monomer with an inorganic acid such as hydrochloric acid, hydrobromic acid, hydroiodic acid or sulfuric acid or an organic acid such as acetic acid, formic acid, p-toluenesulfonic acid or oxalic acid in accordance with a known ammonium salt forming reaction. Alternatively, a monomer of the type (VI) can be obtained by reacting the monomer (V) with an alkyl halide such as methyl chloride or methyl bromide.

Furthermore, the monomer unit of formula (III) can be formed by subjecting a copolymer at least partly containing the monomer unit of formula (II) produced by using the monomer of formula (V) to the aforesaid ammonium salt forming reaction.

The monomer of formula (V) and the monomer of formula (VI) may be used singly or as a mixture. The total amount of the nitrogen-containing acrylic monomers may be 5 to 80% by weight, preferably 30 to 60% by weight, most preferably 35 to 50% by weight, based on the weight of the copolymer. If it is too small, the dyeability of the resulting photocured product is insufficient. Conversely, if it is too large, the photocurability of the copolymer becomes insufficient, and for example, the adhesion of the photocured product to a support is reduced.

The copolymer (A) in this invention may further contain up to 20% by weight, preferably not more than 15% by weight, more preferably not more than 10% by weight, based on the weight of the copolymer, of a structural unit derived from at least one additional copolymerizable monomer together with the monomers of formulae (IV), and (V) and/or (VI). Examples of such additional monomer include acrylic and methacrylic acids; acrylic acid esters, for example $C_1$–$C_6$ alkyl esters of acrylic acid such as methyl acrylate, ethyl acrylate and butyl acrylate and methacrylic acid esters, for example $C_1$–$C_6$ alkyl esters of methacrylic acid such as methyl methacrylate and ethyl methacrylate; maleic acid, fumaric acid and itaconic acid and mono- or di-esters (preferably $C_1$–$C_6$ alkyl esters) of these unsaturated dicarboxylic acids; vinylbenzenesulfonic acid, and (meth)acrylamides such as acrylamide, N-methylol acrylamide, diacetone acrylamide, N,N-dimethyl acrylamide, N-morpholyl acrylamide and methacrylamide; and N-vinylpyrrolidone, acrylonitrile, p-dimethylaminostyrene, 5-ethyl-2-vinylpyridine, N-vinyloxazolidine, 2-vinylpyridine, 4-vinylpyridine and 2-vinylquinoline. Of these, diacetone acrylamide, N,N-dimethylacrylamide, methacrylamide and N-vinylpyrrolidone are preferably used.

The copolymer (A) can be obtained by copolymerizing the aforesaid monomers by a solution polymerization method, a suspension polymerization method, etc. which are known per se. Usually, the solution polymerization method is preferably used. By this reaction, the monomers react almost quantitatively and a copolymer is obtained which contains monomer units of formula (I) and formula (II) and/or formula (III) in proportions substantially corresponding to the amounts of the monomers used. Details of the polymerization methods are described, for example, in W. R. Sorenson, T. W. Campbell, "Preparative Methods of Polymer Chemistry", 1st Ed.. (John Wiley & Sons Inc.), and this publication is cited herein in lieu of giving a detailed description of these methods.

The copolymers (A) so prepared generally have the following properties.

Appearance

White powder

Weight average molecular weight

Several thousand to several hundred thousand

Thermal properties

Even in the absence of light irradiation, temperature elevation induces crosslinking of these copolymers.

Solubility

Well soluble in ethylene glycol monomethyl ether, dimethyl sulfoxide, acetic acid and pyridine. Fairly well soluble in water to form a solution having a pH of 10 to 12. But as the temperature of the solution rises, the solubility of the copolymer decreases, and the copolymer is precipitated. Phase separation, however, becomes difficult when an organic or inorganic acid is added to the solution to make it acidic.

Properties of a film from the copolymers

A slightly yellow transparent film is formed. The film has strong hygroscopicity but when it is crosslinked with a diazo compound or an azide compound, its hydroscopicity is reduced.

When a solution of the photocurable compositon of this invention containing a diazonium salt is cast on a glass substrate, dried and exposed to light irradiation, the cured film does not peel from the glass substrate even when it is left to stand for 10 minutes in boiling water.

Dyeability with acid dyes

The copolymers are easily dyed with levelling dyes even at room temperature. But they can be dyed in deeper colors when dyed with milling dyes at relatively high temperatures (usually about 90° C.). The addition of a small amount of sulfuric acid, acetic acid, etc. in this case is more effective.

In the present invention, a diazo compound or an azide compound is used as a light sensitizer for the aforesaid photocurable copolymers. The "diazo compound" denotes an aromatic, aliphatic or alicyclic compound having at least one, preferably more than two, diazo groups per molecule which has been used previously as a light sensitizer for photocurable resin compositions. Aromatic diazo compounds, especially a diazonium salt, are preferred in this invention. Specific examples include condensation products between p-diazodiphenylamine, 2,5-dimethoxy-4-p-tolylmercaptobenzene diazonium or 2,5-dimethoxy-4-morpholinobenzene diazonium and formaldehyde. The condensate of p-diazodiphenylamine and formaldehyde is especially frequently used.

Since the copolymer (A) in this invention is generally soluble in acidic aqueous solutions, the water-soluble condensate of p-diazodiphenylamine and formaldehyde mentioned above can be directly used conveniently when both the preparation of a photosensitive solution and development are carried out using acidic aqueous solutions. As a solvent for the photosensitive solution, water-soluble organic solvents such as methyl Cellosolve and dimethylformamide may be used alone or as a mixture with water. When the solvent is mixed with water, for example when methyl Cellosolve and water are mixed in a ratio of 50:50, the p-diazodiphenylamine/formaldehyde condensate can be used. When the organic solvent alone is used, it is necessary to use diazo compounds soluble in the organic solvent. Examples of such diazo compounds are diazonium salts formed by the anion exchange reaction between the p-diazodiphenylamine/formaldehyde condensate and hexafluorophosphate salt, a tetrafluoroborate salt, a perchlorate salt, p-toluenesulfonic acid or 2-hydroxy-4-methoxybenzophenone-5-sulfonic acid.

The content of the diazo compound (B) in the composition of this invention is not particularly restricted. It is usually 2 to 30 parts by weight, preferably 5 to 20 parts by weight, more preferably 10 to 15 parts by weight, per 100 parts by weight of the copolymer (A).

When the diazo, compound is water-soluble, it is only sufficient to merely dissolve the diazo compound in an aqueous solution of the copolymer (A). However, since in many cases, the diazo compounds are unstable even in neutral media, it is convenient to adjust the pH of the aqueous solution of the copolymer to the acidic side. For this pH adjustment, there may be added acidic substances to the aqueous solution of the copolymer. Specific examples are inorganic acids such as sulfuric acid, hydrochloric acid and phosphoric acid and organic acids such as acetic acid, oxalic acid, citric acid and p-toluenesulfonic acid. Even when water-insoluble diazonium salts are used, it is preferred to add the aforesaid acidic substances to the aqueous solution of the copolymer (A).

The "azide compound" which can be used as a light sensitizer for the composition of this invention may be an aliphatic, alicyclic or aromatic compound containing at least one azide group, preferably at least 2 azide groups, per molecule which has been used previously as a light sensitizer for photocurable resin compositions. Aromatic azide compounds are especially advantageously used. Since the composition of this invention is preferably prepared as an aqueous photosensitive solution for practical purposes, the azide compound is preferably water-soluble. For this purpose, the azide compound may contain a sulfonic acid group or a sulfonate salt group in addition to the azide group. Examples of such azide compounds include sodium 4,4'-diazidostilbene-2,2'-disulfonate, 2,6-bis(4-azidobenzal)acetone-2-sulfonic acid, 2,6-bis(4-azidobenzal)acetone-2,2'-disulfonic acid, 2,6-bis(4-azidobenzal)cyclohexanone-2,2'-disulfonic acid and 2,6-bis(4-azidobenzal)methylcyclohexanone-2,2'-disulfonic acid.

The content of the azide compound is not critical. It is generally 10 to 30 parts by weight, preferably 15 to 25 parts by weight, per 100 parts by weight of the copolymer (A).

The composition of this invention consisting essentially of the copolymer (A) and the diazo or azide compound (B) may, as required, further contain another polymer or an inorganic substance. Since the polymer in accordance with this invention contains a large amount of a polar group, it is slightly brittle in an absolutely dry condition. Accordingly, in applications where the surface of a film from the composition of this invention is subjected to a direct external force, it is preferable to mix the composition with a pliable water-soluble polymer such as a copolymer of HEMA and a long-chain acrylate, or an emulsion polymer solution stable in an acidic atmosphere. In this case, the amount of the other polymer is preferably not more than 10 parts per 100 parts by weight of the copolymer (A) in order not to impair the objective of the present invention. As the inorganic substance, colloidal silica having a diameter of not more than 0.1 micrometer may be added for viscosity adjustment. Its amount is preferably not more than 1% based on the weight of copolymer (A).

The composition of this invention has the property of being cured by irradiation of actinic light containing ultraviolet light having a wavelength in the range of generally 300 to 450 nm (having a continuous spectrum or a bright line spectrum). Hence, a photosensitive resin plate can be formed by preparing a photosensitive solution from this composition, coating the photosensitive solution on a suitable transparent or non-transparent support such as a glass plate, a polyester film or a metallic plate, and drying the coating.

The preparation of the photosensitive solution from the composition of this invention may comprise dissolving predetermined amounts of the copolymer (A) and the diazo or azide compound (B) in an aqueous medium (for example, water or a mixture of water and a water-miscible organic solvent of the types described hereinabove), and as required, adjusting the pH of the solution to about 2 to about 5 by adding an inorganic or organic acid of the types described hereinabove. The solids concentration of the photosensitive solution so prepared may be varied widely depending upon the type and molecular weight of the copolymer, the thickness of coating on the substrate, or the method of coating on the substrate, etc. Generally, it is conveniently 10 to 20% by weight.

The photosensitive solution so prepared is coated uniformly on the support by using a spinner, a doctor blade, etc., or by dipping, and is dried usually at room temperature to about 60° C. for several minutes to several hours. Thus, generally, a photosensitive resin plate is obtained which has a photosensitive resin layer with a thickness of about 0.5 to about 3 micrometers. Desirably, that surface of the support on which the photosensitive solution is to be coated is ultrasonicated in an aqueous solution of a surface-active agent, and washed with water and then with isopropyl alcohol to remove dirt from the surface.

The photosensitive resin layer of the photosensitive resin plate so produced is then exposed imagewise to irradiation of actinic light, such as light from a mercury lamp, through an image-bearing mask in close contact with it, thereby to photocure the resin.

The mechanism of curing is not entirely clear, but it is presumed that the light irradiation induces generation of radicals from the diazo or azide compound contained in the photosensitive resin laser and by the action of the generated radicals, the hydroxyl groups of the hydroxyl group-containing acrylic monomer units of formula (I) in the copolymer (A) contribute to the crosslinking reaction, and the curing reaction proceeds.

The exposed photosensitive layer is then treated with a developing solution to remove the unexposed portions by dissolving to give a plate having a cured resin image formed thereon. The developing solution may be the same aqueous medium used for the preparation of the photosensitive solution, for example water. Since, however, the copolymer (A) having a high molecular weight tends to have a reduced solubility in water, it is preferable to use an acidic aqueous medium containing 0.5 to 5% of acetic acid, for example. The suitable temperature of the developing solution is generally from room temperature to about 40°"C.

The resinous image can be colored by dipping the resulting plate having the cured resinous image in a dye bath. The dyeing conditions may be varied depending upon the desired degree of coloration. Generally, the developed plate is conveniently dipped in an aqueous solution containing 0.5 to 3% by weight of an acid dye and 0.5 to 5% by weight of acetic acid and maintained at 60° to 100° C. for 1 to 10 minutes. Thereafter, the plate is withdrawn from the dye bath, washed with water and dried.

In contrast to a conventional composition composed mainly of a natural polymer such as casein and a chromium compound, a photosensitive solution of the photocurable resin composition of this invention is stable and does not lose its photosensitivity within short periods of time. Moreover, since it does not require a chromium compound, it is highly safe.

Furthermore, the copolymer in the composition of this invention scarcely discolors upon contact with oxygen in the air.

By using the composition of this invention, a photosensitive film having good adhesion to a support such as a glass plate can be obtained. After it is exposed to the radiation of actinic light, curing reaction takes place rapidly to give a cured film which can be dyed in a high density with acid dyes.

The colored cured film can be used, for example as a color filter for color liquid crystal display devices, a color filter for television camera tubes or elements.

The following examples further illustrate the present invention.

EXAMPLE 1

Fifty grams of 2-hydroxyethyl methacrylate (HEMA for short), 40 g of dimethylaminopropyl methacrylamide (DMAPMA for short), 10 g of methacrylamide, 0.8 g of azobisisobutyronitrile (AIBN for short) and 200 g of methyl Cellosolve were put in a 500 ml round-bottomed separable flask, and nitrogen gas was introduced into it. They were stirred at 40° C. until a uniform solution formed. The uniform solution was then stirred at 70° C. for 5 hours.

The reaction mixture was poured into cyclohexane and suction-filtered. The solid was left to stand at room temperature for 1 day, and dried in vacuum at 30° C. for 5 hours to give 98.5 g of a copolymer containing 48.9% by weight of HEMA units and 41.5% by weight of DMAPMA units.

A photosensitive solution was prepared from 0.4 g of the resulting copolymer, 0.04 g of a diazonium salt (Diazo Resin D013, a product of Shinko Gikensha Co., Ltd.), 0.06 g of acetic acid and 3.6 g of deionized water. The photosensitive solution was filtered through a 1 micrometer filter and then a 0.45 micrometer filter. Separately, a glass plate was ultrasonicated in an aqueous solution of a surface-active agent, washed with pure water and isopropyl alcohol in this order, and dried. The glass plate was placed on a rotating plate of a spinner and while it was rotated at 300 rpm, the photosensitive solution was dropped onto the glass plate. Then, the spinner was rotated at 3000 rpm for 30 seconds, and the rotating plate was put in an air circulating dryer and dried at 30° C. for 30 minutes to give a photosensitive film having a thickness of 0.59 micron.

The photosensitive film was brought into close contact with a mask film for a resolution testing, and exposed for 20 seconds to irradiation of light from a 1 KW superhigh pressure mercury lamp placed at a distance of 1 m.

The exposed photosensitive film was developed for 1 minute in a 0.5% aqueous solution of acetic acid at 40° C. and dried to give line image areas having a thickness of 0.32 micron.

The sample plate was dipped for 1 minute in a dye bath at 90° C. consisting of 10 g of edible red #105 (red dye produced by Hodogaya Chemical Co., Ltd.; Color Index, Acid Red 94) and 990 g of water, washed with water and dried.

The image was clear and brilliant and had an absorbance at 560 nanometers of 1.53.

Comparative Example 1

A mixture composed of 50 g of HEMA, 50 g of dimethylacrylamide, 1.0 g of AIBN and 200 g of methyl Cellosolve was put in a 500 ml flask, and stirred for 5 hours to a temperature of 70° C. while introducing nitrogen gas into it.

The reaction mixture was precipitated in cyclohexane, and dried to give 99.2 g of a white powder.

A photosensitive solution was prepared from this polymer in accordance with the same formulation as in Example 1, coated on a glass plate and exposed to ultraviolet light. The photosensitive plate was developed with water and dipped in the same dye bath as in Example 1. The cured image was dyed only in very pale red.

EXAMPLE 2

| HEMA | 45 g |
|---|---|
| DMAPMA | 40 g |
| Dimethylacrylamide | 15 g |
| AIBN | 1.0 g |
| Methyl Cellosolve | 200 g |

A mixture of the above formulation was stirred at 70° C. for 5 hours in a nitrogen atmosphere to obtain a copolymer containing 44.1% by weight of HEMA units and 39.5% by weight of DMAPMA units. A photosensitive solution was prepared from this copolymer in accordance with the same formulation as in Example 1, and coated on a glass plate to form a photosensitive film. The photosensitive film was exposed to ultraviolet light, developed and dried. The thickness of the line image areas was 0.21 micron.

The sample plate was dipped for 1 minute in a dye bath at 90° C. consisting of 10 g of Sandran Brilliant Blue N-5GM 200% (Produced by Sando Company, Color Index Acid Blue 142), 10 g of acetic acid and 980 g of water, washed with water and dried.

The resulting blue image was clear and brilliant and had an absorbance at 590 nanometers of 2.94.

EXAMPLE 3

| HEMA | 55 g |
|---|---|
| Diethylaminoethylacrylamide (DEAEAA for short) | 25 g |
| Dimethylacrylamide | 20 g |
| AIBN | 0.7 g |
| Methyl Cellosolve | 200 g |

A mixture of the above formulation was stirred at 70° C. for 5 hours. The reaction product was precipitated in cyclohexane, and dried to give 94.6 g of a copolymer containing 55.3% by weight of HEMA units and 25.4% by weight of DEAEAA units.

A photosensitive film was prepared from this polymer by the same method as in Example 1, exposed to ultraviolet light and developed.

The line image areas of the dried sample plate had a thickness of 0.75 microns.

When this sample plate was dyed in the same dye bath as in Example 1, the dyed image had an absorbance at 560 nanometers of 1.31.

EXAMPLE 4

A photosensitive solution was prepared using the copolymer obtained in Example 1.

| Copolymer | 0.4 g |
|---|---|
| Sodium 4,4-diazidostilbene-2,2'-disulfonate | 0.08 g |
| Water | 19.5 g |

The photosensitive solution was coated on a glass plate and dried. The coated glass plate was exposed for 3 minutes to irradiation of light from a superhigh pressure mercury lamp placed at a distance of 1 m from it, and washed with water. The sample plate obtained was dipped in the same dye bath as used in Example 2. An image of deep brilliant color was obtained.

EXAMPLE 5

A 500 ml flask was charged with 160 g of water and 40 g of isopropyl alcohol, and heated to 67° C. While nitrogen gas was introduced into the flask, the solution was stirred. While a mixture of 3 g of 2,2'-azobis(2-aminopropane) hydrochloride and 27 g of water was added dropwise, a monomeric mixture composed of 50 g of HEMA, 40 of methacrylol aminopropyl trimethyl ammonium chloride and 10 g of methacrylamide was added dropwise simultaneously. The mixture was stirred for 5 hours to give a clear polymer solution. The solution was diluted with water to a concentration of 10%, and coated on a glass plate in the same way as in Example 1. The coated glass plate was dried, exposed, developed and dyed in the same way as in Example 1 to give a clear and brilliant colored image.

What we claim is:

1. A photocurable resin composition comprising a uniform mixture of:
(A) 100 parts by weight of a copolymer which is water-soluble and dyeable with an acid dye and which is composed of, as structural units,
   (a) 20 to 70% by weight of a hydroxyl group-containing acrylic monomer unit represented by the formula

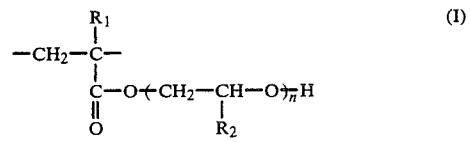

wherein $R_1$ and $R_2$, independently from each other, represent hydrogen, methyl or ethyl, and n is 1, 2 or 3, and
   (b) 25 to 60% by weight of a nitrogen-containing acrylic monomer unit represented by at least one of the formulae

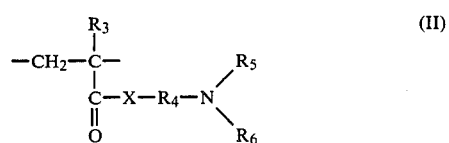

and

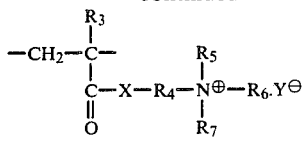

wherein $R_3$ represents hydrogen or methyl, X represents O or NH, $R_4$ represents a linear or branched alkylene group having 2 or 3 carbon atoms, $R_5$, $R_6$ and $R_7$, independently from each other, represent hydrogen or a linear or branched alkyl group having 1 to 4 carbon atoms, and $Y^\ominus$ represents an anion of an acid, and (B) 2-30 parts by weight of a diazo compound containing at least two diazo groups per molecule, or 10-30 parts by weight of an azide compound containing at least two azide groups per molecule, as a light sensitizer for the copolymer.

2. The composition of claim 1 wherein the hydroxyl group-containing acrylic monomer units are derived from 2-hydroxyethyl methacrylate.

3. The composition of claim 1 wherein the nitrogen-containing acrylic monomer units are derived from N,N-dimethylaminopropyl methacrylamide.

4. The composition of claim 1 wherein the diazo compound is a condensation product between p-diazodiphenylamine and formaldehyde.

5. The composition of claim 1 wherein the azide compound is sodium 4,4'-diazidostilbene-2,2'-disulfonate.

6. The composition of claim 1 wherein the copolymer contains up to 20% by weight of other monomeric units.

7. The composition of claim 2 wherein the nitrogen-containing acrylic monomer units are derived from N,N-dimethylaminopropyl methacrylamide, and the diazo compound is a condensation product between p-diazodiphenylamine and formaldehyde.

* * * * *